(12) United States Patent
Wu et al.

(10) Patent No.: US 9,697,989 B2
(45) Date of Patent: Jul. 4, 2017

(54) METHOD FOR GENERATING PARAMETER PATTERN, ION IMPLANTATION METHOD AND FEED FORWARD SEMICONDUCTOR MANUFACTURING METHOD

(71) Applicant: TAIWAN SEMICONDUCTOR MANUFACTURING COMPANY LTD., Hsinchu (TW)

(72) Inventors: Cheng-Ta Wu, Chiayi County (TW); Tsung Han Wu, Tainan (TW); Yao-Wen Hsu, New Taipei (TW); Lun-Kuang Tan, Hsinchu (TW); Wei-Ming You, Taipei (TW); Ting-Chun Wang, Tainan (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 2 days.

(21) Appl. No.: 14/632,719

(22) Filed: Feb. 26, 2015

(65) Prior Publication Data

US 2016/0254122 A1  Sep. 1, 2016

(51) Int. Cl.
*G21K 5/10* (2006.01)
*H01J 37/317* (2006.01)
(Continued)

(52) U.S. Cl.
CPC ........ *H01J 37/3172* (2013.01); *H01J 37/304* (2013.01); *H01J 37/3026* (2013.01);
(Continued)

(58) Field of Classification Search
CPC .......... H01J 37/00; H01J 37/02; H01J 37/045; H01J 37/05
(Continued)

(56) References Cited

U.S. PATENT DOCUMENTS

| 4,751,393 A * | 6/1988 | Corey, Jr. ............. | H01J 37/244 250/397 |
| 2004/0063225 A1* | 4/2004 | Borden .................. | G01N 21/21 438/7 |

(Continued)

FOREIGN PATENT DOCUMENTS

TW          201440176 A       10/2014

OTHER PUBLICATIONS

TIPO office action dated Nov. 10, 2016 for corresponding Taiwan application 104137681.

*Primary Examiner* — Jason McCormack
(74) *Attorney, Agent, or Firm* — WPAT, P.C., Intellectual Property Attorneys; Anthony King

(57) ABSTRACT

The present disclosure provides a method for generating a parameter pattern including: performing a plurality of measurements upon a plurality of regions on a surface of a workpiece to obtain a plurality of measured results; and deriving a parameter pattern according to the plurality of measured results by a computer; wherein the parameter pattern includes a plurality of regional parameter values corresponding to each of the plurality of regions on the surface of the workpiece. The present disclosure provides a Feed Forward semiconductor manufacturing method including: forming a layer with a desired pattern on a surface of a workpiece; deriving a control signal including a parameter pattern according to spatial dimension measurements against the layer with the desired pattern distributed over a plurality of regions of the surface of the workpiece; and performing an ion implantation on the surface of the workpiece according to the control signal.

17 Claims, 7 Drawing Sheets

(51) Int. Cl.
*H01J 37/302* (2006.01)
*H01J 37/304* (2006.01)

(52) U.S. Cl.
CPC .............. *H01J 2237/2814* (2013.01); *H01J 2237/2815* (2013.01); *H01J 2237/2817* (2013.01); *H01J 2237/30461* (2013.01); *H01J 2237/30483* (2013.01); *H01J 2237/3171* (2013.01); *H01J 2237/31703* (2013.01)

(58) Field of Classification Search
USPC ............. 250/492.2, 492.22, 492.23, 492.3
See application file for complete search history.

(56) References Cited

U.S. PATENT DOCUMENTS

| | | | | |
|---|---|---|---|---|
| 2009/0065853 | A1* | 3/2009 | Hanafi | H01L 29/1054 |
| | | | | 257/327 |
| 2009/0283669 | A1* | 11/2009 | Parrill | H01J 37/05 |
| | | | | 250/281 |
| 2009/0321632 | A1* | 12/2009 | Grant | H01J 37/04 |
| | | | | 250/288 |
| 2011/0036990 | A1* | 2/2011 | Stone | H01J 37/20 |
| | | | | 250/423 R |
| 2011/0227094 | A1* | 9/2011 | Wahl | H01L 21/26506 |
| | | | | 257/77 |
| 2012/0009692 | A1* | 1/2012 | Hui | H01J 37/302 |
| | | | | 438/14 |
| 2014/0246697 | A1* | 9/2014 | Schulze | H01L 29/165 |
| | | | | 257/192 |

\* cited by examiner

METHOD FOR GENERATING PARAMETER PATTERN, ION IMPLANTATION METHOD AND FEED FORWARD SEMICONDUCTOR MANUFACTURING METHOD

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication operation) has decreased.

Among fabrication operations, ion implantation is extensively used in manufacturing semiconductor integrated circuits. Both N and P wells, for example, are generally created by ion implantation. By ion implantation, the amount of impurities in a workpiece such as a semiconductor wafer is altered, so as to introduce conductivity. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material to form a region of desired conductivity. The ion beam may be distributed over the wafer area by beam movement, wafer movement, or by any combination thereof.

The conventional operation for wafer implantation typically requires a consistent dose or amount of ions for implantation into the wafer during the implanting operation. In this way, an ion implantation amount implanted over the entire region of the wafer is made to be uniform. As semiconductor chips and devices tend to become miniaturized, variation in one or more other operational steps has become crucial to the ion implantation operation inevitably.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
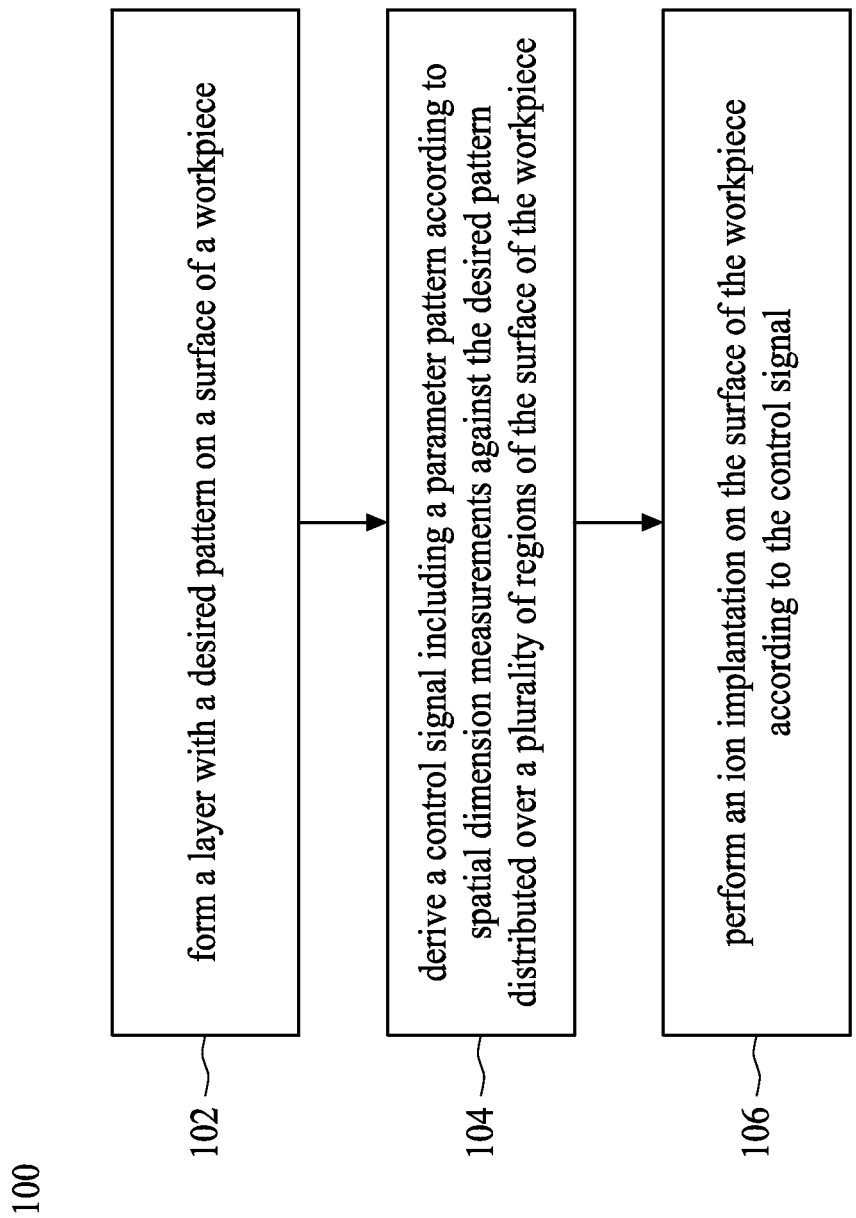
FIG. 1 is an operational flowchart of a feed forward (FFW) semiconductor manufacturing method according to an exemplary embodiment of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During wafer manufacturing, various techniques may be used during a multi-step operation. One of the techniques is known to be a Feed Forward (FFW) operation. In one exemplary FFW operation, information from at least one previous step is used to define an operational condition in a subsequent step. The subsequent step includes a job on a given operation tool. A FFW operation can in some instances reduce wafer-to-wafer variation (e.g., as measured by a Wafer Acceptance Test), and meanwhile may create multiple operation jobs for each wafer.

Some FFW operations employ a lot-based mode. In the lot-based mode, data from only a subset of wafers in a lot are measured while the other wafers in the lot where the subset belongs are bypassed (i.e., are not measured). Then, the wafers in the lot are subjected to an operation job. In other words, for a particular step in the operation job, the same recipe is applied to all of the wafers in the lot. As a result, the entire lot may be operated in the operation tool at the same time (assuming that the tool has capacity to accommodate the entire lot). A benefit of the lot-based mode is that it decreases the number of operation jobs, thereby decreasing the time to operate each lot. However, the lot-based mode may have increased wafer-to-wafer variation by the coarse "inspection resolution" (hereinafter "resolution").

In a wafer-based mode, by contrast, operational conditions are individually defined for each wafer. Therefore, each wafer can be directed to a corresponding recipe for a particular step. The wafer-based recipe can effectively compensate or calibrate process variations among wafers. For example, in a wafer-based ion implantation FFW operation, a mean value of some measured results made to a wafer may be referenced by a predetermined program embedded in a computer system. The predetermined program is configured to calculate a parameter or a control signal in accordance with the mean value. The parameter or the control signal is subsequently input to the downstream ion implanter. By using the ion implanter, ions are implanted into the surface of the wafer according to the calculated parameter.

The wafer-based ion implantation FFW operation performs ion beam scanning uniformly on a surface of each single wafer. In such a way, a resolution has been narrowed down from a lot-based scale to a wafer-based scale. However, as the size of wafer keeps growing, process variations within a wafer have become non-neglectable and should be taken into account. In light of this, the instant invention discloses an ion implantation method and an associated FFW semiconductor manufacturing method. The concept of the present disclosure mainly includes a region-based ion implantation FFW operation, where the resolution is further increased compared with the lot-based scale and the wafer-based scale. Greater details are described as follows.

FIG. 1 is an operational flowchart of an FFW semiconductor manufacturing method 100 according to an exemplary embodiment of the disclosure. In particular, the FFW semiconductor manufacturing method 100 may be applicable to any semiconductor manufacturing operations with ion implantation operation included. In accordance with operation 102 of the method 100 shown in FIG. 1, a layer with a desired pattern is formed on a surface of a workpiece. The workpiece referred herein may take various physical shapes such as a common disk shape. The workpiece may be a semiconductor wafer fabricated from any type of semiconductor material such as silicon or any other material. Forming the layer with the desired pattern may refer to forming semiconductor devices or semiconductor component of a given type, such as forming fins of a FinFET with a predetermined line width, forming a shallow trench isolation region with a predetermined thickness, forming a gate oxide with a predetermined thickness or forming an epitaxy layer with a predetermined volume. Pertinent details will be provided in the following paragraphs with various embodiments.

In operation 104, a parameter pattern represented by a control signal is derived according to spatial dimension measurements against the layer with the desired pattern distributed over a plurality of regions of the surface of the workpiece. Regarding operation 104, first of all, in order to obtain spatial dimension measurement results, a plurality of measurements may be performed upon the layer with the desired pattern distributed over the plurality of regions on the surface of the workpiece. The measurements may be particularly pertinent to a given appearance characteristic, such as spatial dimension, of the pattern of the layer. In some embodiments, the measurements may be obtained from the electrical characteristic of the semiconductor devices or component parts. The measurements may be automatically executed by a computer program. In some embodiments, the computer program may be in charge of evaluating a scanning electron microscope (SEM) image so as to automatically output the dimension of predetermined devices under test (DUT). However, this is not a limitation of the disclosure. In fact, any other types and ways of measurement all fall into the scope of the disclosure. In some embodiment, the computer program may enable a user, via a user interface (UI) for example, to input a desired partition of the workpiece. The computer program may then virtually divide the surface of the workpiece into a plurality of regions. The plurality of regions may be partitioned by a plurality of coordinates including, but not limited to, Cartesian coordinates and Polar coordinates in response to the partition number input by the user.

Figure 2:
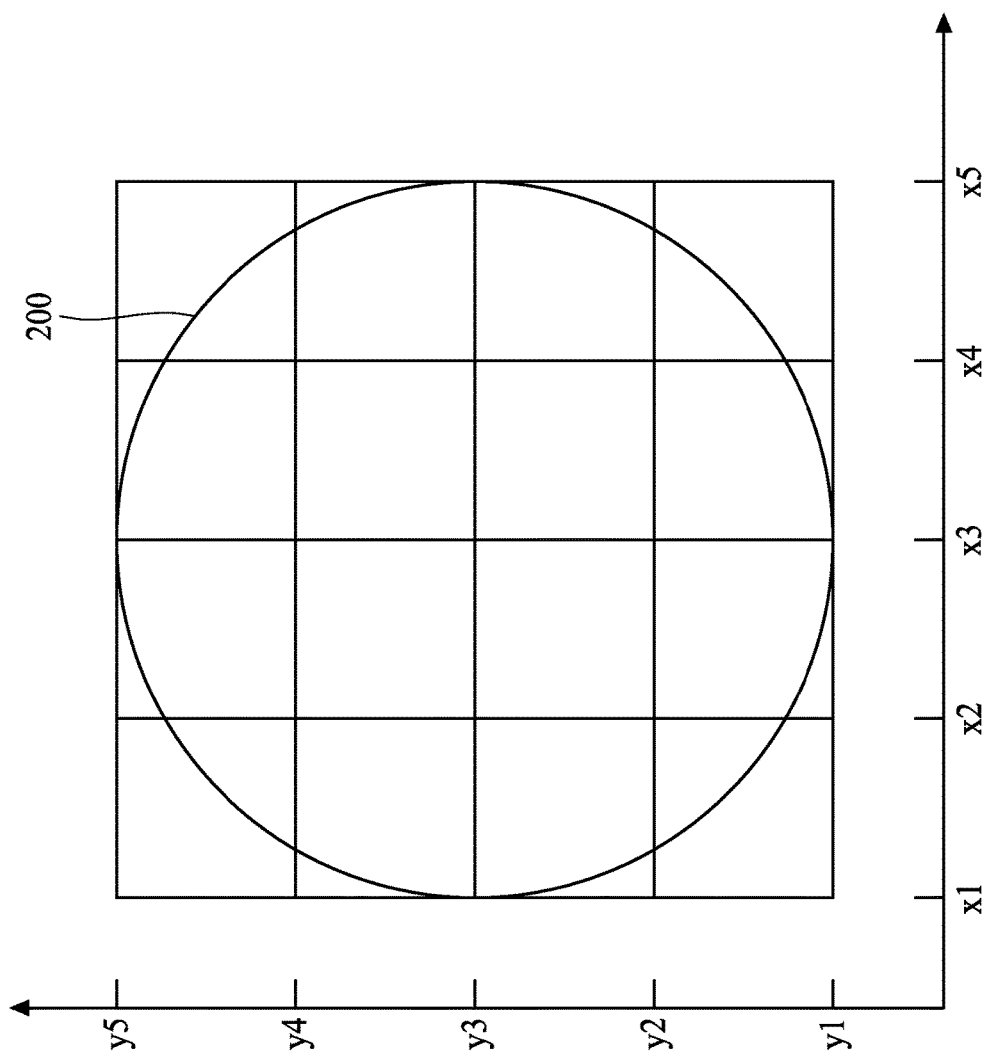
FIG. 2 is a view of a front surface of the workpiece virtually divided by coordinates according to some embodiments of the disclosure.

FIG. 2 is a view of a front surface of the workpiece 200 virtually divided by coordinates. The partition result of the workpiece 200 is 16 equally divided regions defined by X coordinates x1-x5 and Y coordinates y1-y5 as shown in FIG. 2. In practice, the number of regions may be arbitrarily altered depending on how severe the manufacturing process variation condition is. In some embodiments, the number of regions may be determined by a size of the workpiece 200. In some embodiments, the number of regions may be determined by chip dies included in the workpiece 200. Normally, a greater number of partitioned regions possesses a higher precision/resolution. By a higher precision/resolution, the region-based FFW operation may be able to mitigate effects introduced by the manufacturing process variation within workpiece 200 and thereby to improve yield by some aspect. For example, the overall device leakage current may be reduced. The measurements may take place on a predetermined position at each virtual region of the front surface of the workpiece 200. In some embodiments, the spatial dimension measurement may be performed upon given test pads near the desired pattern in each region.

In some embodiment, the number of measured results may equal to the total number of the partitioned regions on the front surface of the workpiece 200, e.g. a total of 16 measured results against the workpiece 200 may be obtained. In some embodiments, the number of measured results may be an integer multiples of the number of the partitioned regions on the front surface of the workpiece 200, e.g. a total of 32 measured results against the workpiece 200 may be obtained. In some embodiment, the measurement may be performed at a single predefined location of each region on the workpiece 200. In some embodiment, the measurement may be performed at several predefined locations of each region on the front surface of the workpiece 200. In some embodiment, the measurement may be performed at one location of each location for only one time. In some embodiment, the measurement may be performed repeatedly upon a same location of each region on the front surface of the workpiece 200 for multiple times.

Return to operation 104. A parameter pattern may be derived according to the aforementioned measured results, where the measured results can be spatial dimension measurements against the desired pattern distributed over a plurality of regions of the surface of the workpiece 200. The parameter pattern includes a plurality of regional parameter values. Each regional parameter value may relate to a region on the surface of the workpiece 200. In other words, because the measured result obtained from different regions may be distinct from each other, the regional parameter values derived from the measured result may be also distinct from each other. In some embodiments, the regional parameter values may be of a certain type of the ion implantation parameters. In some embodiments, the regional parameter values may be a combination of several types of the ion implantation parameters. The ion implantation parameters mentioned here can be parameters used to control or set the condition of the scanning beam of the implanter at the ion implantation operation. However, this is not a limitation of the disclosure.

Figure 3:
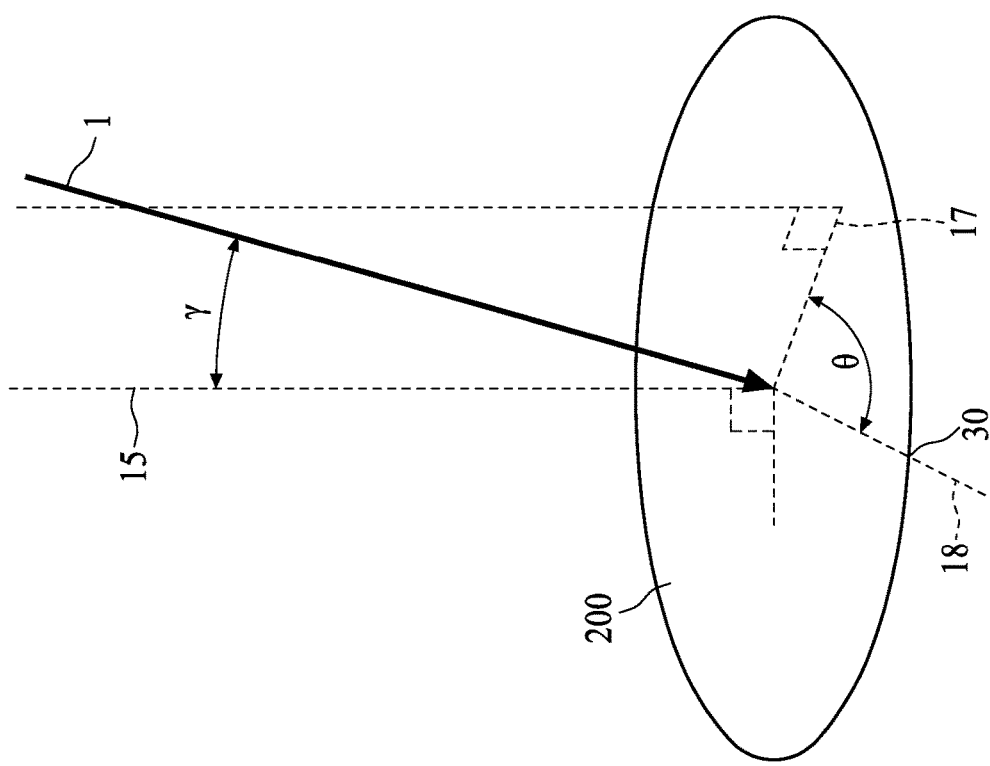
FIG. 3 is a perspective view showing an ion beam impinging the workpiece.

In some embodiments, the regional parameter values may include an ion beam scanning velocity of the ion implanter. In some embodiments, the regional parameter values may include an angle (i.e. a tilt angle) at which impurity ions should be implanted in relation to the normal of the surface of the workpiece 200. In some embodiments, the regional parameter values may include a rotational angle (i.e. a twist angle) at which impurity ions should be implanted for inhibiting channeling. Specifically, impurity ions implanted in a single crystal silicon semiconductor substrate should be inhibited to reach deep inside the semiconductor substrate by channeling in the ion implantation operation. To this end, the ion beam is emitted at an angle in relation to the normal line of the surface of the workpiece 200. FIG. 3 is a perspective view showing an ion beam entering the workpiece 200. As shown in FIG. 3, the tilt angle γ is an angle between a normal line 15 of the surface of the workpiece 200 and the ion beam 1. The twist angle θ is an angle between a projected line 17 of the ion beam 1 on the workpiece 200 and a line 18 passing through a center and a reference point of the workpiece 200. In some embodiments, the reference point 30 may be a notch having a specific shape in convex.

The regional parameter values may be derived by referring to a predefined relationship between the semiconductor appearance characteristics (such as the spatial dimension or the electrical characteristics) and the parameter values of the ion implantation. To obtain the relationship between the semiconductor appearance characteristics and the parameter values of the ion implantation, some pre-operation may be conducted in advance. In some embodiments, a trial and error operation may be iteratively made to the FFW loop on test wafers or chips. The functionality of deriving the regional parameter values may be implemented in any suitable form including hardware, software, firmware or any combination of these. In some embodiments, the functionality of deriving the regional parameter values may be implemented, at least partly, as computer software running on one or more data processors and/or digital signal processors or configurable module components such as FPGA devices. In light of above, the elements and components of an embodiment may be physically, functionally and logically implemented in any suitable way. In some embodiments, the functionality may be implemented in a single unit. In some embodiments, the functionality may be implemented in a plurality of units or as part of other functional units.

Figure 4:
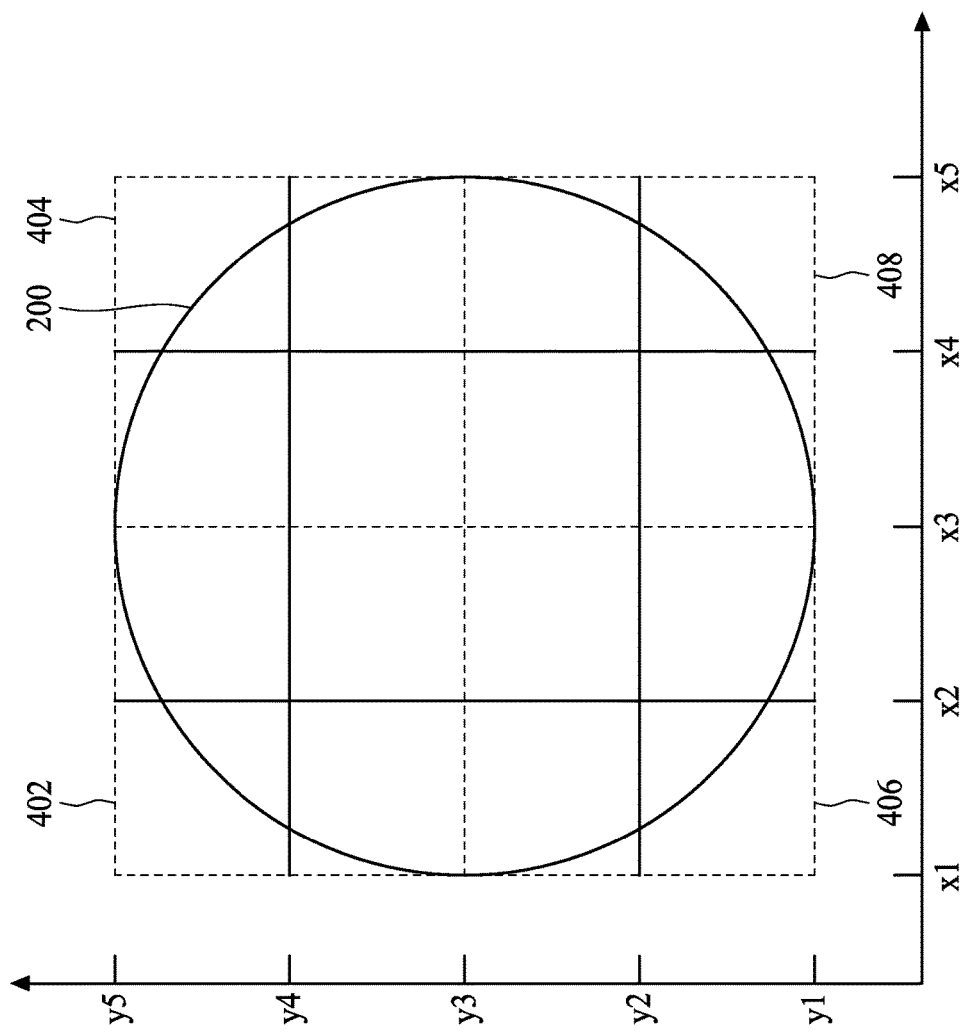
FIG. 4 is a top view of a front surface of the workpiece with a one-to-four mapping manner.

In some embodiments, the parameter pattern may be composed of 16 regional parameter values. Each regional parameter value corresponds to an individual region on the surface of the workpiece 200 in a one-to-one mapping manner. In some embodiments, the parameter pattern may only include four regional parameter values. Each regional parameter value corresponds to four regions on the surface of the workpiece 200 in a mapping manner of one-to-four as shown in FIG. 4. FIG. 4 is a view of a front surface of the workpiece 200 having a one-to-four mapping manner. In FIG. 4, the four measured results obtained in the regions defined by X coordinates x1 and x3 and Y coordinates y1 and y3, i.e. a region 406 marked by dashed lines, are averaged to obtain a mean value representing the four sub-regions in the region 406. The four measured results obtained in the regions defined by X coordinates x3 and x5 and Y coordinates y1 and y3, i.e. a region 408 marked by dashed lines, are averaged to obtain another mean value representing the four sub-regions in the region 408, and so forth regarding regions 402 and 404. Four regional parameter values are then derived from the four mean values; thereby the four regional parameter values form a parameter pattern. However, this is not a limitation of the disclosure. In some embodiments, a more complicated computation may be employed to derive the regional parameter values based on the associated measured results.

The parameter pattern may be used to control a downstream tool such as an ion implanter in the subsequent ion implantation operation to complete the FFW loop. In some embodiments, the parameter pattern may be converted to a specific kind of format, such as a control signal which is electrically coupled to an input signal terminal of a controller of the ion implanter. In some embodiment, the parameter pattern may be input to a downstream semiconductor tool by a user through a graphical user interface (GUI). This also falls into the scope of the disclosure.

In accordance with an operation 106 of the method 100 shown in FIG. 1, an ion implantation is performed on the surface of the workpiece according to the control signal. Please note that the instant disclosure is described herein specifically in connection with an ion implanter. However, the disclosure may be applicable to alternative systems or operations that use beams of energetic charged particles. The ion implanter may include an ion beam generator and a controller consistent with an embodiment of the disclosure. The ion beam generator may generate an ion beam and direct it towards the front surface of the workpiece 200. In some embodiments, the ion beam may be distributed over the front surface of the workpiece 200 by beam movement, workpiece movement, or by any combination thereof.

The ion beam generator of the ion implanter may include various types of components and systems to generate the ion beam with desired characteristics. The ion beam may be a spot beam or a ribbon beam. The spot beam may have an irregular cross-sectional shape that may be approximately circular in one instance. The spot beam may be a fixed or stationary spot beam without a scanner. Alternatively, the spot beam may be scanned by a scanner for providing a scanned ion beam. The ribbon beam may have a large width/height aspect ratio and may be at least as wide as the workpiece 200. The ion beam can be any type of charged particle beam, such as an energetic ion beam used to implant the workpiece 200.

The ion implanter may support one or more workpieces in the path of the ion beam such that ions of the desired species are implanted into the workpiece 200. The workpiece 200 may be supported by a platen and clamped to the platen by known techniques such as electrostatic wafer clamping. The ion implanter may include a workpiece drive system to physically move the workpiece 200 to and from the platen from holding areas. The ion implanter may also include a drive mechanism to drive the platen and hence the workpiece 200 clamped to the platen in a desired way. The drive mechanism may include servo drive motors, screw drive mechanisms, mechanical linkages, and any other components as are known in the art to drive the workpiece 200 when clamped to the platen. The ion implanter may further include a position sensor.

The controller of the ion implanter may receive input data and instructions (such as the control signal generated by an upstream operation step of the FFW loop) from any variety of systems and components of the ion implanter and provide output signals to control the components of the ion implanter. The controller can be or include a general-purpose computer or network of general-purpose computers that may be programmed to perform desired input/output functions. The controller of the ion implanter may also include communication devices so that the control signal can be wirelessly received. The controller may include a user interface system to allow a user to input commands and/or data and/or to monitor the ion implanter via the controller. The user interface system may include, but not be limited to, devices such as touch screens, keyboards, user pointing devices, displays and printers.

The controller of the ion implanter may be configured to receive the control signal including the parameter pattern for the front surface of the workpiece 200. In response to the control signal including the parameter pattern, the controller may control at least one parameter of the ion beam generator when the ion beam is impinged on the front surface of the workpiece 200 to directly create a desired ion implantation pattern in each of the plurality of regions on the surface of the workpiece 200. As mentioned before, the parameter of the ion beam generator may be the beam scanning velocity, the tilt angle, the twist angle or any combinations thereof.

Figure 5:
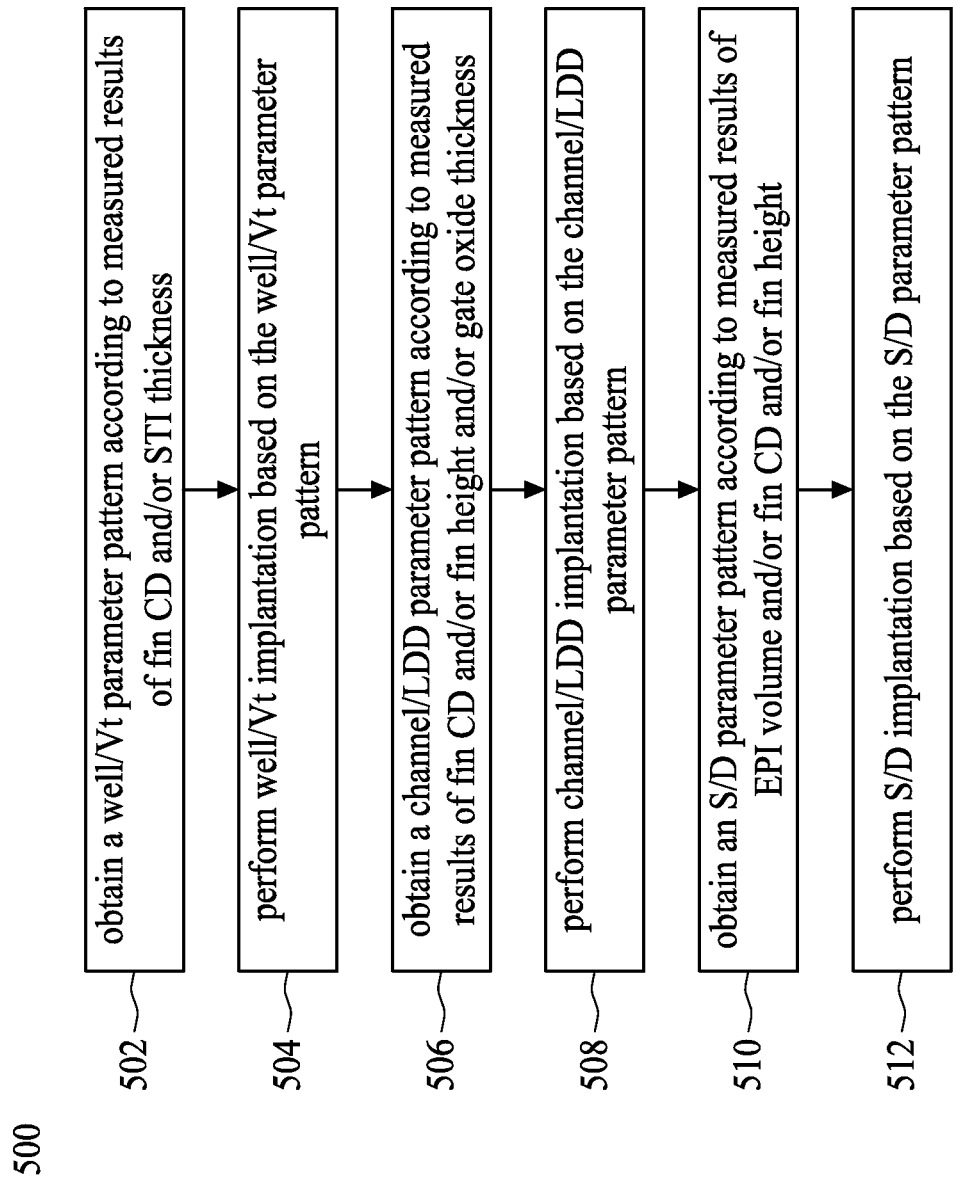
FIG. 5 is an operational flowchart of an FFW method associated with a FinFET manufacturing operation according to some embodiments of the disclosure.

FIG. 5 is an operational flowchart of an FFW method 500 associated with a FinFET manufacturing operation according to an embodiment of the disclosure. The FFW method 500 includes a well/Vt loop (operations 502-504), a channel/LDD loop (operations 506-508) and an S/D loop (operations 510-512). The well/Vt loop includes several steps related to the formation of a deep isolation (i.e. well) and a threshold voltage adjustment (i.e. Vt) of the FinFET. The channel/LDD loop includes several operations related to the formation of a channel and a lightly doped drain (i.e. LDD) of the FinFET. The S/D loop includes several operations related to the formation of a source (i.e. S) and a drain (i.e. D) of the FinFET. Please note that only operations related to ion implantation are illustrated in FIG. 5 for clarity.

The concept of the well/Vt loop, the channel/LDD loop and the S/D loop substantially comply with the region-based FFW operation mentioned in the preceding paragraphs. In some embodiments, the resolution (i.e., the number of partitioned regions) of each loop may not be the same with each other. In other words, the resolutions of a well/Vt parameter pattern, a channel/LDD parameter pattern and an S/D parameter pattern may be distinct from each other. In some embodiments, the resolution may be determined based on for example, how sensitive the ion implantation can be to a specific type of spatial dimension variation. For a loop that performance of the end product can be severely affected by the process variation during ion implantation, the resolution of the loop may need to be set greater than other loops less sensitive to the process variation during ion implantation. However, this is not a limitation of the disclosure.

According to the operation 502 of the well/Vt loop, the well/Vt parameter pattern is derived by measuring at least a critical dimension (i.e. CD) or a line width of a Fin and/or a thickness of a shallow trench isolation (i.e. STI) region. In practice, types of the spatial dimension measured herein may alternatively change depending on the actual manufacturing process and/or other factors. Specifically, the CD of the Fin and the thickness of the STI are correlated to the volume of the fin protruding from the STI, and these spatial dimension measurement results may be useful to determine an amount of dosage applied in the downstream well/Vt ion implantation operation 504, in order to achieve a substantially uniform electrical characteristic of the semiconductor devices in each region of the workpiece 200. Consequently, in some embodiments, the well/Vt parameter pattern may relate to the bean scanning velocity of the ion beam. Specifically, when a larger dosage is intended to be implanted in some regions of the workpiece compared with other regions of the same workpiece, the bean scanning velocity at the larger dosage regions will be lower. In some embodiments, different beam scanning velocity designated to each of the plurality of regions on the surface of a workpiece forma parameter pattern feeding to the downstream ion implanter.

Figure 6:
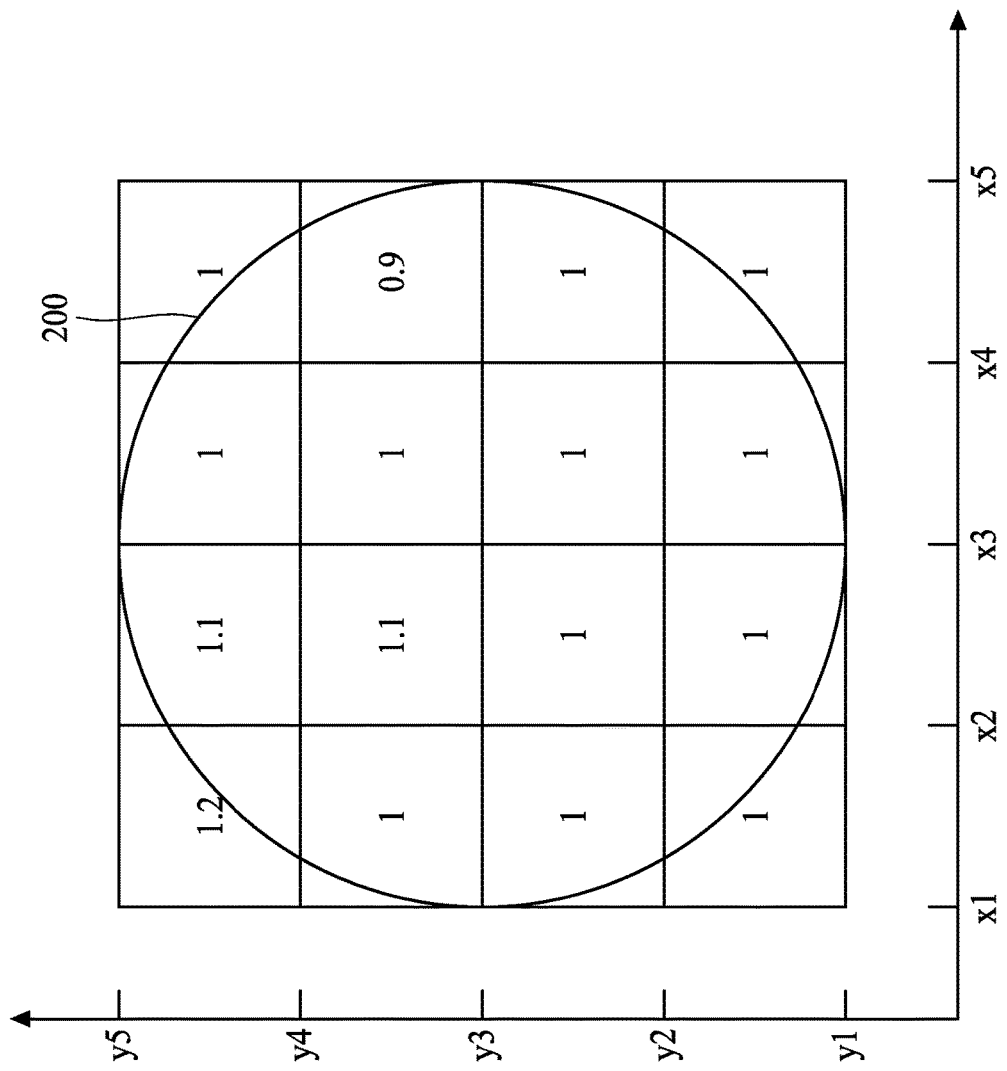
FIG. 6 is a view of measured results of STI thickness in 16 regions of the workpiece according to some embodiments of the disclosure.
Figure 7:
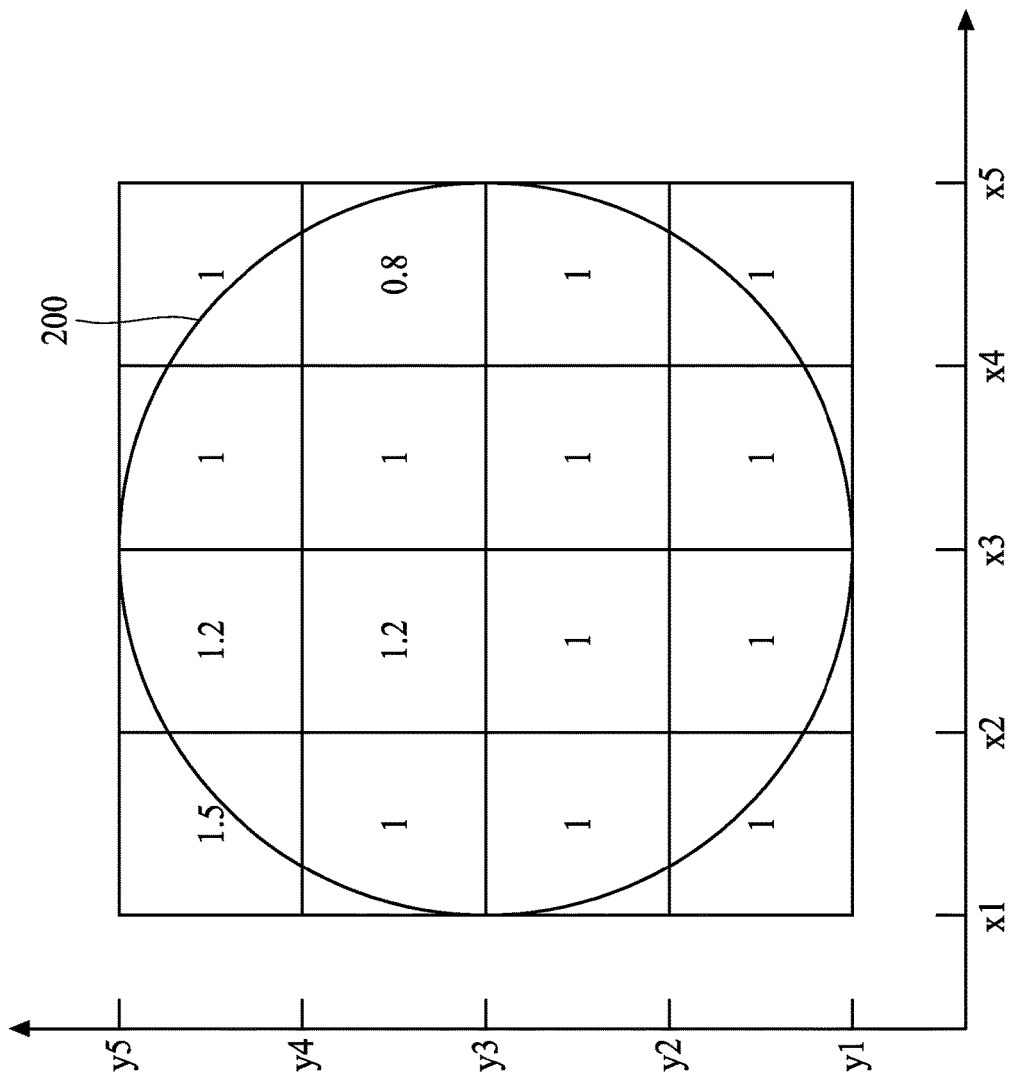
FIG. 7 is a view of a well/Vt parameter pattern in 16 regions of the workpiece according to some embodiments of the disclosure.

FIG. 6 is a view of measured results of STI thickness in 16 regions of the workpiece 200. Each region is marked by a number to indicate the measured results of the STI, wherein the numbers represent the relation of the measured STI thickness with respect to the desired STI thickness at the normal situation. For example, the number in the region defined by X coordinates x1 and x2 and Y coordinates y4 and y5 indicates the measured STI thickness is 1.2 times thicker than the desired thickness (i.e. the reference); the number in the region defined by X coordinates x2 and x3 and Y coordinates y3 and y4 indicates the measured STI thickness is 1.1 times thicker than the desired thickness; and the number in the region defined by X coordinates x4 and x5 and Y coordinates y3 and y4 indicates the measured STI thickness is 0.9 times the desired thickness. Suppose the thickness of STI is the only variable to be taken into account and the beam scanning velocity of the ion implanter can be derived according to a function comprising the STI thickness as a variable, then the well/Vt parameter pattern can be directly derived at least according to information, i.e., the STI thickness, shown in FIG. 6. FIG. 7 is a view of a well/Vt parameter pattern in 16 regions of the workpiece 200. For brevity, well/Vt parameter values in the well/Vt parameter pattern are simply representative of the beam scanning velocity in this embodiment, wherein the value "1" represents a normal or a reference velocity. It can be seen that a trend of the scanning velocity variation in response to the STI thickness substantially complies with the mechanism mentioned above. Specifically, the regional parameter values shown in FIG. 7 are substantially in proportion to the STI thickness shown in FIG. 6.

According to the operation 506 of the channel/LDD loop, the channel/LDD parameter pattern is derived by measuring at least a CD of a Fin, a fin height of a FinFET and/or a thickness of a gate oxide. Similarly, types of the spatial dimension employed herein may alternatively change depending on the actual manufacturing process and/or other factors. The CD of the Fin, the fin height and the thickness of the gate oxide may not only affect the amount of dosage, but also may indicate how severe the shadowing affect is. In some embodiments, the channel/LDD parameter pattern may be composed of regional parameters obtained by combining the beam scanning velocity and tilt angle of the ion beam. For example, some regions with higher fins require a larger tilt angle compared with other region with a fin height close to a baseline value. According to the operation 510 of the S/D loop, the S/D parameter pattern is derived by measuring at least a CD of a Fin, a fin height and/or volume of an epitaxy region. The operation of the S/D loop is similar to the channel/LDD loop, and details are omitted here for simplicity.

Some embodiments of the present disclosure provide a method for generating a parameter pattern. The method includes performing a plurality of measurements upon a plurality of regions on a surface of a workpiece to obtain a plurality of measured results; and deriving a parameter pattern according to the plurality of measured results by a computer. The parameter pattern includes a plurality of regional parameter values corresponding to each of the plurality of regions on the surface of the workpiece.

In some embodiments of the present disclosure, the surface of the workpiece is partitioned by at least one horizontal line and at least one vertical line.

In some embodiments of the present disclosure, the surface of the workpiece includes a layer with a desired pattern, and the plurality of measurements are performed upon the pattern in each of the plurality of regions.

In some embodiments of the present disclosure, the plurality of measurements relate to measuring a spatial dimension of the layer.

In some embodiments of the present disclosure, the spatial dimension of the layer is a critical dimension of a line width.

In some embodiments of the present disclosure, the spatial dimension of the layer is the critical dimension of the line width of a FinFET.

In some embodiments of the present disclosure, the spatial dimension of the layer is a thickness of shallow trench isolation.

In some embodiments of the present disclosure, the spatial dimension of the layer is a step height.

In some embodiments of the present disclosure, the step height is a thickness of gate oxide.

In some embodiments of the present disclosure, the spatial dimension of the layer is a dimension of EPI volumes.

Some embodiments of the present disclosure provide an ion implantation method. The method includes performing a plurality of measurements upon a plurality of regions on a surface of a workpiece to obtain a plurality of measured results; deriving a control signal including a parameter pattern according to the plurality of measured results; and inputting the control signal to an ion implanter to achieve a desired ion implantation pattern in each of the plurality of regions. The parameter pattern includes a plurality of regional parameter values corresponding to the plurality of regions on the surface of the workpiece.

In some embodiments of the present disclosure, the surface of the workpiece includes a layer with a desired pattern, and the plurality of measurements are performed upon the pattern in each of the plurality of regions, and the plurality of measurements relate to measuring a spatial dimension of the layer.

In some embodiments of the present disclosure, the step of deriving the control signal including the parameter pattern according to the plurality of measured results includes averaging the measured results obtained from the plurality of regions.

In some embodiments of the present disclosure, the step of performing the plurality of measurements upon the plurality of regions to obtain the plurality of measured results includes repeatedly performing measurements upon at least one of the plurality of regions.

In some embodiments of the present disclosure, the step of deriving the control signal including the parameter pattern according to the plurality of measured results includes averaging the measured results of the repeated measurements on at least one of the plurality of regions.

In some embodiments of the present disclosure, the parameter pattern relates to a tilt angle for achieving the desired ion implantation pattern.

In some embodiments of the present disclosure, the parameter pattern relates to a twist angle for achieving the desired ion implantation pattern.

In some embodiments of the present disclosure, the parameter pattern relates to an ion scanning velocity for achieving the desired ion implantation pattern.

Some embodiments of the present disclosure provide a Feed Forward semiconductor manufacturing method. The method includes forming a layer with a desired pattern on a surface of a workpiece; deriving a control signal including a parameter pattern according to spatial dimension measurements against the layer with the desired pattern distributed over a plurality of regions of the surface of the workpiece; and performing an ion implantation on the surface of the workpiece according to the control signal. The parameter pattern includes a plurality of regional parameter values corresponding to the plurality of regions on the surface of the workpiece.

In some embodiments of the present disclosure, the layer includes a layer of fins of FinFETs, a shallow trench isolation layer, a gate oxide layer or an EPI volume layer; and the ion implantation operation includes well/Vt ion implantation, channel/LDD ion implantation or S/D ion implantation.

What is claimed is:

1. A method for generating a parameter pattern, comprising:
    performing N*X measurements upon N*X regions in a first size on a surface of a workpiece to obtain N*X measured results; and
    deriving a parameter pattern corresponding to X regions in a second size on the surface of the workpiece according to the N*X measured results by a computer, wherein the second size is greater than the first size, and each of the X regions in the second size includes N of the N*X regions in the first size;
    wherein the parameter pattern comprises X regional parameter values;
    wherein the surface of the workpiece includes a layer with a desired pattern, and the N*X measurements are performed upon the pattern in each of the N*X regions in the first size; and the measurements relate to measuring a spatial dimension of the layer; and
    wherein each of the X regional parameter values corresponds to a mean value of N of the N*X measured results performed upon N regions in the first size adjacent to each other on the surface of the workpiece, N and X being integers greater than 1.

2. The method of claim 1, wherein the surface of the workpiece is partitioned by at least one horizontal line and at least one vertical line.

3. The method of claim 1, wherein the spatial dimension of the layer is a critical dimension of a line width.

4. The method of claim 3, wherein the spatial dimension of the layer is the critical dimension of the line width of a FinFET.

5. The method of claim 1, wherein the spatial dimension of the layer is a thickness of a shallow trench isolation.

6. The method of claim 1, wherein the spatial dimension of the layer is a step height.

7. The method of claim 6, wherein the step height is a thickness of gate oxide.

8. The method of claim 1, wherein the spatial dimension of the layer is a dimension of EPI volumes.

9. An ion implantation method, comprising:
    performing N*X measurements upon N*X regions in a first size on a surface of a workpiece to obtain N*X measured results;
    deriving a control signal comprising a parameter pattern according to the N*X measured results; and
    inputting the control signal to an ion implanter to achieve a desired ion implantation pattern in X regions in a second size on the surface of the workpiece, wherein the second size is greater than the first size, and each of the X regions in the second size includes N of the N*X regions in the first size;
    wherein the parameter pattern comprises X regional parameter values;
    wherein the surface of the workpiece includes a layer with a desired pattern, and the N*X measurements are performed upon the pattern in each of the N*X regions in the first size, and the measurements relate to measuring a spatial dimension of the layer; and wherein each of the X regional parameter values corresponds to a mean value of N of the N*X measured results performed upon N regions in the first size adjacent to each other on the surface of the workpiece, N and X being integers greater than 1.

10. The ion implantation method of claim 9, wherein the step of deriving the control signal comprising the parameter pattern according to the plurality of measured results comprises:

averaging the measured results obtained from the plurality of regions.

11. The ion implantation method of claim 9, wherein the step of performing the plurality of measurements upon the plurality of regions to obtain the plurality of measured results comprises:

repeatedly performing measurements upon at least one of the plurality of regions.

12. The ion implantation method of claim 11, wherein the deriving the control signal comprising the parameter pattern according to the plurality of measured results comprises:

averaging the measured results of the repeated measurements on at least one of the plurality of regions.

13. The ion implantation method of claim 9, wherein the parameter pattern relates to a tilt angle for achieving the desired ion implantation pattern.

14. The ion implantation method of claim 9, wherein the parameter pattern relates to a twist angle for achieving the desired ion implantation pattern.

15. The ion implantation method of claim 9, wherein the parameter pattern relates to an ion scanning velocity for achieving the desired ion implantation pattern.

16. A Feed Forward semiconductor manufacturing method, comprising:

forming a layer with a desired pattern on a surface of a workpiece;

deriving a control signal comprising a parameter pattern according to N*X spatial dimension measurements against the layer upon N*X regions in a first size on the surface of the workpiece, the parameter pattern being with the desired pattern distributed over X regions in a second size on the surface of the workpiece, wherein the second size is greater than the first size, and each of the X regions in the second size includes N of the N*X regions in the first size; and performing an ion implantation on the surface of the workpiece according to the control signal;

wherein the parameter pattern comprises X regional parameter values; and each of the X regional parameter values corresponds to a mean value of N of the N*X measured results of the spatial dimension measurements performed upon N regions in the first size adjacent to each other on the surface of the workpiece, N and X being integers greater than 1.

17. The Feed Forward semiconductor manufacturing method of claim 16, wherein the layer comprises a layer of fins of FinFETs, a shallow trench isolation layer, a gate oxide layer or an EPI volume layer; and the ion implantation comprises well/Vt ion implantation, channel/LDD ion implantation or S/D ion implantation.

* * * * *